US009509305B2

(12) United States Patent
Nascimento et al.

(10) Patent No.: US 9,509,305 B2
(45) Date of Patent: Nov. 29, 2016

(54) POWER GATING TECHNIQUES WITH SMOOTH TRANSITION

(71) Applicant: Freescale Semiconductor, Inc., Austin, TX (US)

(72) Inventors: Ivan Carlos Ribeiro Nascimento, Campinas (BR); Akshat Gupta, New Delhi (IN); Sunny Gupta, Noida (IN); Akshay K. Pathak, Noida (IN); Adriano Marques Pereira, Campinas (BR); Garima Sharda, Ghaziabad (IN); Pedro Barbosa Zanetta, Campinas (BR)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 296 days.

(21) Appl. No.: 14/151,337

(22) Filed: Jan. 9, 2014

(65) Prior Publication Data
US 2015/0194887 A1    Jul. 9, 2015

(51) Int. Cl.
*H03K 5/08*      (2006.01)
*H03K 19/00*    (2006.01)

(52) U.S. Cl.
CPC ................. *H03K 19/0013* (2013.01)

(58) Field of Classification Search
CPC .................................................... H02M 3/158
USPC ............................ 327/309–330; 323/271–272
See application file for complete search history.

(56) References Cited

U.S. PATENT DOCUMENTS

| 6,236,194 | B1 | 5/2001 | Manabe |
| 6,407,596 | B1 * | 6/2002 | Taft .................... H03K 5/00006 327/116 |
| 7,463,013 | B2 * | 12/2008 | Plojhar .................. G05F 3/262 323/311 |
| 9,242,109 | B2 * | 1/2016 | Gordon .................. A61N 1/378 |
| 2010/0060078 | A1 | 3/2010 | Shaw |
| 2013/0002213 | A1 * | 1/2013 | Khare ..................... G05F 1/563 323/266 |
| 2013/0147446 | A1 | 6/2013 | Kris |

* cited by examiner

*Primary Examiner* — Lincoln Donovan
*Assistant Examiner* — Metasebia Retebo (57) ABSTRACT

In an embodiment, an electronic device includes an integrated circuit (IC) having a plurality of power domains, a first regulator coupled to a given power domain, a second regulator coupled to the given power domain, and a switching circuit coupled between the first and second regulators and configured to control an amount of current drawn by the power domain from the first and/or second regulators. In another embodiment, a method includes controlling an impedance of a switching circuit to change an amount of current, the switching circuit coupled to a given power domain of an IC configured to operate in a first mode followed by a second mode, where the switching circuit is coupled to a first regulator configured to provide more power to the IC than a second regulator, and a transition period includes turning off the first regulator and turning on the second regulator.

20 Claims, 7 Drawing Sheets

POWER GATING TECHNIQUES WITH SMOOTH TRANSITION

FIELD

This disclosure relates generally to electronic circuits and devices, and more specifically, to systems and methods for enabling power gating techniques with smooth transition.

BACKGROUND

Techniques for managing the power consumption of electronic devices may include the use of Integrated Circuits (ICs) having multiple power domains. Generally speaking, each power domain may allow a circuit block within the IC to use a different amount of power than other circuit blocks. For example, the use of power domains may enable one or more circuit blocks to receive different amounts of power depending upon the device's mode of operation, which can change over time.

In some cases, different power domains may be separated by one or more power switches or the like. For example, when a circuit block within a given power domain is turned on, a corresponding switch may allow that circuit to draw electrical current from a power source. These techniques are often referred to as "power gating."

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity and have not necessarily been drawn to scale.

DETAILED DESCRIPTION

Figure 1:
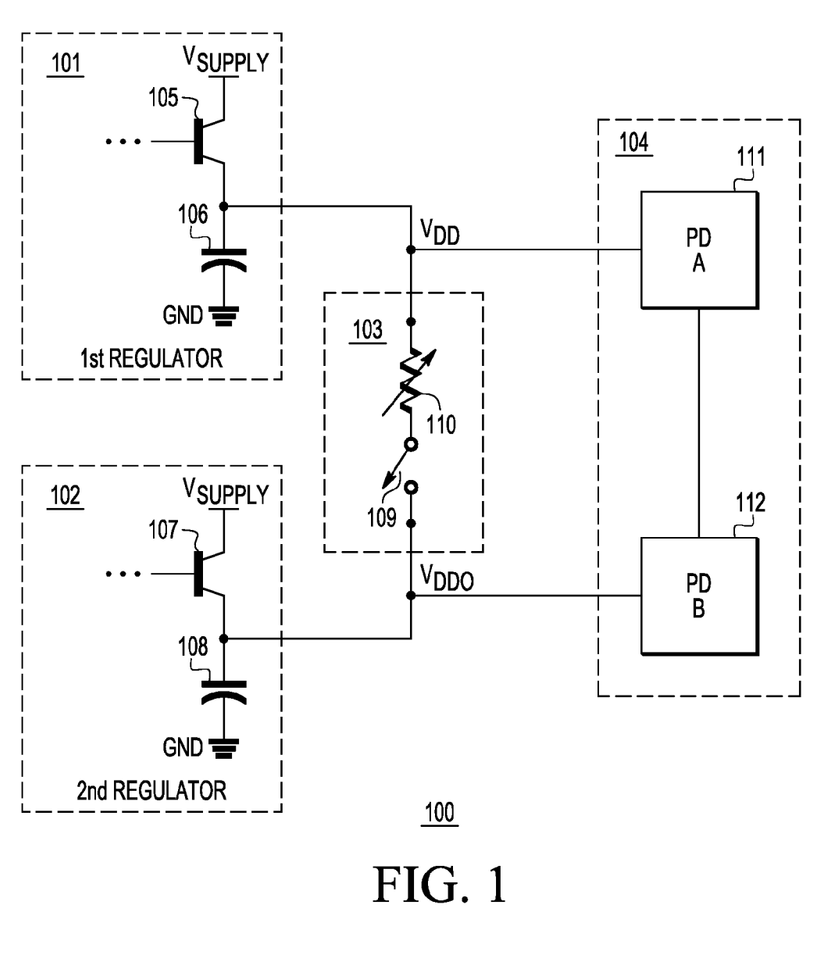
FIG. 1 is a block diagram of an example of an electronic device according to some embodiments.

Turning to FIG. 1, a block diagram of an example of an electronic device 100 is depicted according to some embodiments. In this example, first regulator 101 and second regulator 102 are coupled to integrated circuit 104 having two or more power domains (PDs) 111 and 112, respectively. First regulator 101 and second regulator 102 are also coupled to switching circuit 103. In some implementations, second regulator 102, switching circuit 103, and integrated circuit 104 may all be within the same electronic package, and first voltage regulator 101 may be external to that electronic package. For example, first regulator 101 may be a high power voltage regulator and second regulator 102 may be a low power (or ultra-low power) voltage regulator.

For sake of illustration, first regulator 101 is shown as receiving $V_{SUPPLY}$ at transistor 105 and outputting $V_{DD}$ at an output node between transistor 105 and capacitor 106, which in turn is coupled to a reference node (GND). Similarly, second regulator 102 receives $V_{SUPPLY}$ at transistor 107 and outputs $V_{DDO}$ at an output node between transistor 107 and capacitor 108, which in turn is coupled to GND. It should be understood, however, that each of regulators 101 and 102 may include a number of other internal electronic components in addition to and/or as an alternative to those shown herein. In some implementations, each of regulators 101 and 102 may be a different type of voltage regulator including, but not limited to, linear regulators, switching regulators, etc.

Generally speaking, switching circuit 103 operates to separate the various power domains 111 and 112. Even when power domains 111 and 112 are configured to operate based on the same supply voltage, they may each be configured to draw up to a maximum amount of current from regulators 101 and/or 102. For example, power domain 111 may be configured to use up to 500 mA and power domain 112 may be configured to use up to 50 mA.

In some embodiments, switching circuit 103 may be configured to limit an amount of current drawn by a given one of power domains 111 and 112 from regulators 101 and/or 102 during a transition period—e.g., during a switching between (i) a high power mode where $V_{DD}$ is provided by first regulator 101 and second regulator 102 is turned off, and (ii) a low power mode where $V_{DDO}$ is provided by second regulator 102 and first regulator 101 is turned off. In some implementations, during at least a part of such a transition period, both the first and second regulators 101 and 102 may be turned on. Outside of the transition period, switching circuit 103 may be configured to consume zero Direct Current (DC) power, also known as static power, be it closed or open (excluding consumption due to leakage effects or the like).

For example, when device 100 is operating in high power mode, first regulator 101 may output a voltage $V_{DD}$ slightly higher than voltage $V_{DDO}$ that would otherwise be output by second regulator 102, and therefore second regulator 102 may be turned off. Particularly, when both first and second regulators 101 and 102 have the same nominal output voltage (e.g., 1.2 V), certain variations may still cause them to output slightly different voltages (e.g., 1.21 and 1.18 V). Then, at some point during operation of device 100, a determination may be made that device 100 begin operating in a low power mode.

At the beginning of the transition period, switch 109 within switching circuit 103 may be in a closed state—i.e., fully conductive—and, at the end of the transition period, switch 109 may be in an open state—i.e., fully non-conductive. In between these two states, current limitation element 110 of switching circuit 103 may operate to control an amount of current that is allowed to flow from first regulator 101 to second regulator 102, and therefore it may also control an amount of current that can be drawn by a given one of power domains 111 and/or 112 from the first and/or second regulators 101 and 102. In some cases, the current limitation provided by switching circuit 103 may impose gradually increasing limits upon that amount of current, which then promotes a smooth transition between the two operating modes (e.g., from a high power mode to a low power mode), as described in more detail below.

In some embodiments, power domains 111 and 112 may represent different areas of integrated circuit 104 responsible for performing different operations. For example, each of power domains 111 and 112 may include analog circuits, digital memories, processors, etc. Moreover, it should be noted that device 100 is shown for sake of illustration only. In various embodiments, any number of power supplies, switches, and/or power domains may be used, and these elements may be coupled to one another in any suitable manner.

Figure 2:
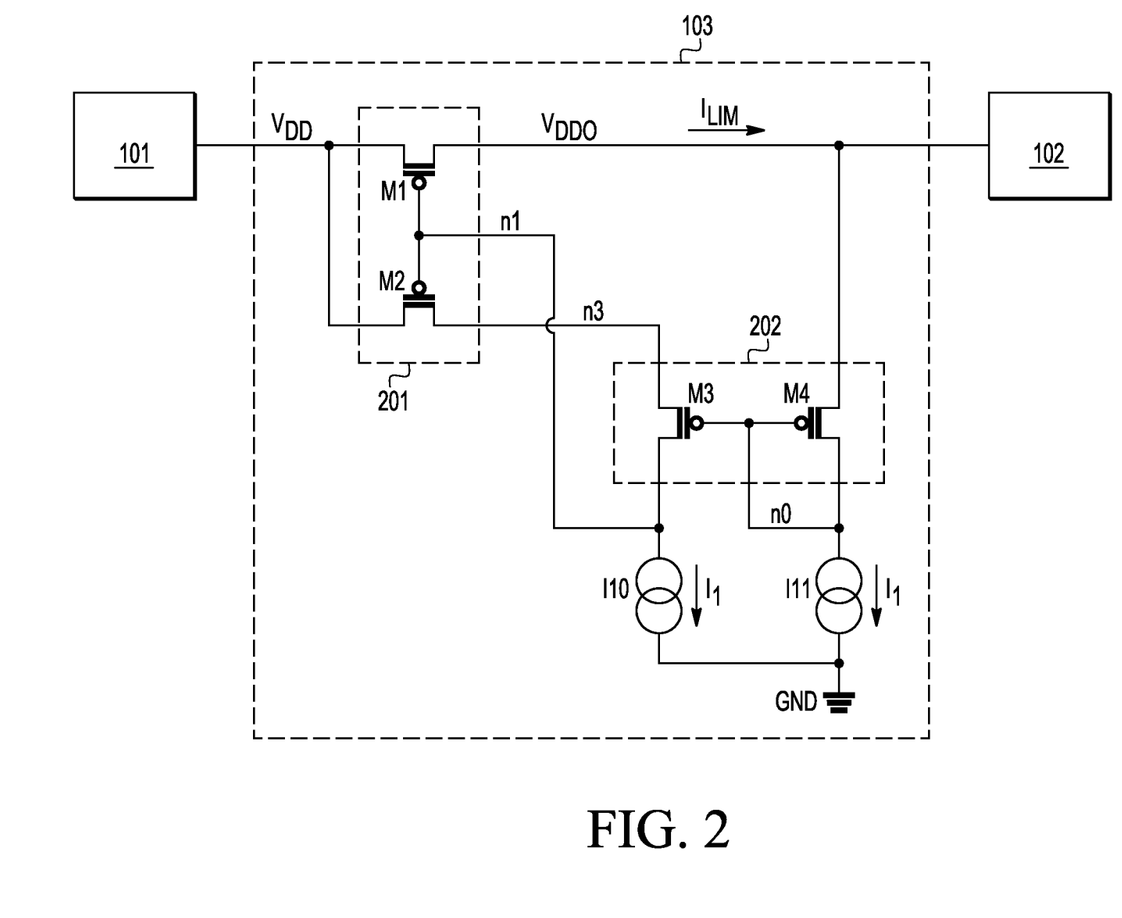
FIG. 2 is a circuit diagram of an example of a power switch with current limitation according to some embodiments.

FIG. 2 is a circuit diagram of an example of switching circuit 103 with current limitation according to some embodiments. For sake of context, switching circuit 103 is shown coupled between first regulator 101 and second regulator 102, as originally discussed in FIG. 1. It will be understood, however, that switching circuit 103 may be used in other contexts as well.

As illustrated, switching circuit 103 includes first P-type Metal-Oxide-Semiconductor (PMOS) transistor M1 having its source terminal (more generally referred to as a first current terminal or electrode) coupled to first regulator 101, thus receiving supply voltage $V_{DD}$, and its drain terminal (more generally referred to as a second current terminal or electrode) coupled to power domain 105B, thus providing $V_{DDO}$ (where $V_{DDO}$ is equal to $V_{DD}$ minus the voltage drop across M1). Second PMOS transistor M2 has its source terminal coupled to first regulator 101, thus also receiving supply voltage $V_{DD}$, and its gate (more generally referred to as a control terminal or electrode) coupled to the gate of first PMOS transistor M1. In combination, transistors M1 and M2 form first current mirror 201. As shown in more detail below, M1 operates as a current limitation transistor, whereas M2 operates as a main switching transistor.

Switch 103 also includes third PMOS transistor M3 having its source terminal coupled to the drain terminal of second PMOS transistor M2, and its drain terminal coupled to node n1 and to the gates of the first and second PMOS transistors M1 and M2, respectively. Fourth PMOS transistor M4 has its source terminal coupled to the drain terminal of first PMOS transistor M1, its drain terminal coupled to node n0, and its gate terminal coupled to the gate terminal of third PMOS transistor M3 and to node n0. As such, transistors M3 and M4 form second current mirror 202. Current source I10 is coupled between node n1 and a reference node (GND) 106, and current source I11 is coupled between node n0 and the reference node 106. Current sources I10 and I11 may be implemented using well-known components.

Nodes n0, n1, and n3 are shown such that node n1 is the node between the gate terminals of transistors M1 and M2, the drain terminal of transistor M3, and current source I10. Node n0 is the node between the gate terminals of transistors M3 and M4, the drain terminal of transistor M4, and current source I11. Node n3 is the node between the drain of transistor M2 and the source of transistor M3.

In operation, switching circuit 103 allows only a limited amount of electrical current $I_{LIM}$ to flow through it. The analysis that follows shows, among other things, that $I_{LIM}$ is a function of the current at the drain terminals of transistors M3 and M4, designated as $I_1$, as well as of the aspect ratios of transistors M1 and M2.

For transistors M3 and M4 let us define:

$$K_{34} = \frac{W_3/L_3}{W_4/L_4}$$

where $W_n$ is the width and $L_n$ is the length of the channel formed in transistor $M_n$ such that $W_3/L_3$ is the aspect ratio of transistor M3 and $W_4/L_4$ is the aspect ratio of transistor M4. For example, in some embodiments, transistors M3 and M4 may be unbalanced such that $W_4/L_4$ is greater than $W_3/L_3$. Also, in some implementations, the gate-to-source voltage of transistor M3 ($V_{GS3}$) is greater than the gate-to-source voltage of transistor M4 ($V_{GS4}$), such that $K_{34}<1$. As such, the current equations for transistors M3 and M4 in saturation are:

$$I_{D3} = \frac{K_P}{2} \cdot \frac{W_3}{L_3} \cdot (V_{GS3} - V_T)^2 = I_1$$

$$I_{D4} = \frac{K_P}{2} \cdot \frac{W_4}{L_4} \cdot (V_{GS4} - V_T)^2 = I_1$$

where $I_{Dn}$ is the drain current of transistor $M_n$. If we use $V_T$ as the threshold voltage and $K_p$ as the transconductance parameter for transistor M3, then:

$$V_{GS4} = V_T + \sqrt{\frac{I_1}{\frac{K_P}{2} \cdot \frac{W_4}{L_4}}}$$

Considering M3 to be in its saturation region, this yields:

$$\frac{W_3}{L_3} \cdot (V_{GS3} - V_T)^2 = \frac{W_4}{L_4} \cdot (V_{GS4} - V_T)^2, \text{ and}$$

$$\sqrt{K_{34}} \cdot (V_{GS3} - V_T) = (V_{GS4} - V_T)$$

The difference of $V_{GS}$ drop voltages, in saturation region, considering the same $I_1$ current pass by M3 and M4 is calculated. The $\Delta V_{GS34}$ is then calculated as:

$$\Delta V_{GS34} = (V_{GS3} - V_{GS4}) = \left(\frac{1}{\sqrt{K_{34}}} - 1\right) \cdot (V_{GS4} - V_T)$$

In conclusion, while ($V_{GS3}-V_{GS4}$) is equal or greater than $\Delta V_{GS34}$, transistor $M_3$ allows $I_1$ current to pass, and, therefore, $V_{DSM3}$ will be low (whether transistor $M_3$ is in saturation, triode or linear regions). Conversely, if $V_{GS3}$ is not higher than $V_{GS4}$ by at least $\Delta V_{GS34}$, then transistor $M_3$ just allow a current lower than $I_1$ to pass, and $V_{DS3}$ increases.

The remainder of the analysis depends upon whether transistors $M_1$ and $M_2$ are operating either in saturation mode or in triode/linear modes. Particularly, when $V_{DD}>>V_{DDO}$, transistors M1 and M2 are in saturation region. The saturation region is defined as the region where the $V_{DS}$ drop voltages of $M_1$ and $M_2$ are above the saturation $V_{DS}$, that is, $V_{DS1}>v_{DS\_SAT\_M1}$ and $V_{DS2}>V_{DS\_SAT\_M2}$, where:

$$V_{DS1}=V_{DD}-V_{DDO} \text{ and } V_{DS2}=V_{DD}-V(n3)$$

According to the MOS model, the minimum $V_{DS}$ for saturation is given by:

$$V_{DS\_SAT\_M2}=V_{GSM2}-V_T=V_{DD}-V(n1)-V_T \text{ and}$$
$$V_{DS\_SAT\_M1}=V_{GSM1}-V_T=V_{DD}-V(n1)-V_T$$

In order to ensure that M1 and M2 are in the saturation region, the equations above can be rewritten as:

$$V_{DD}-V_{DDO}>V_{DD}-V(n1)-V_T \text{ and } V_{DD}-V(n3)>V_{DD}-V(n1)-V_T$$

Writing the saturation region equation for $M_2$ and considering $I_{D2}=I_1$ yields:

$$I_{D2} = I_1 = \frac{K_P}{2} \cdot \frac{W_2}{L_2} \cdot (V_{GS2} - V_T)^2$$

Further, writing the saturation region equation for $M_1$ considering $V_{GS1}=V_{GS2}$ we obtain $I_{D1}$:

$$I_{D1} = I_{LIM} = \frac{K_P}{2} \cdot \frac{W_1}{L_1} \cdot (V_{GS2} - V_T)^2$$

Finally, combining both equations for transistors $M_1$ and $M_2$ provides the following equation for $I_{LIM}$:

$$I_{LIM} = I_1 \frac{W_1/L_1}{W_2/L_2} \qquad \text{Eq. 1}$$

In other words, when transistors $M_1$ and $M_2$ are in saturation, the current provided to power domain 105B is limited to $I_{LIM}$. This current is a function of $I_1$ as well as the sizes of M2 and M1, and can be held constant.

Transistors M1 and M2 are in triode and linear regions when their drain-to source voltages ($V_{DS}$) are equal or below the saturation $V_{DS}$, that is $V_{DSM1} \leq V_{DS\_SAT\_M1}$ and $V_{DSM2} \leq V_{DS\_SAT\_M2}$. These conditions yield:

$$V_{DD}-V_{DDO} \leq V_{DD}-V(n1)-V(n1)-V_T \text{ and } V_{DD}-V(n3) \leq V_{DD}-V(n1)-V_T$$

From the equations above we deduct that $V_{DSM3} \geq V_T$. Hence, writing the $I_{D2}$ equation in triode region results in:

$$I_{D2} = I_1 = K_P \cdot \frac{W_2}{L_2} \cdot \left\{ (V_{GS2} - V_T) \cdot V_{DS2} - \frac{V_{DS2}^2}{2} \right\}$$

By circuit inspection is possible to see that:

$$V_{DS2}+V_{GS3}=V_{DS1}+V_{GS4}.$$

Because:

$$V_{DS1}=V_{DD}-V_{DDO} \text{ and } V_{GS3}-V_{GS4}=\Delta V_{GS34}$$

it results that:

$$V_{DS2}=V_{DS1}-\Delta V_{GS34}=V_{DD}-V_{DDO}-\Delta V_{GS34}$$

Accordingly, $$(V_{GS2} - V_T) = \frac{1}{V_{DS2}} \cdot \left\{ \frac{I_1}{K_P \cdot W_2/L_2} + \frac{V_{DS2}^2}{2} \right\}, \text{ and}$$

$$I_{D1} = I_{LIM} = K_P \cdot \frac{W_2}{L_2} \cdot \left\{ (V_{GS2} - V_T) \cdot V_{DS1} - \frac{V_{DS1}^2}{2} \right\}$$

As such, current $I_{LIM}$, when M1 and M2 are in triode region, depends on $\Delta V_{GS34}$ voltage, $I_1$ current, and $V_{DD}-V_{DDO}=V_{DS1}$. Looking into the above equations is possible to notice that $V_{DS2}$ has the $-\Delta V_{GS34}$ term when compared to $V_{DS1}$. This way $V_{DS2}$ will decrease more than $V_{DS1}$. Also considering that $V_{GS2}$ is inversely proportional to $V_{DS2}$, the net effect is that while $V_{DDO}$ approaches to $V_{DD}$ value, $V_{DS1}$ decreases, $V_{DS2}$ decreases more and $V_{GS2}$ increases making $I_{LIM}$ also increase.

$V_{GS2}$ voltage will increase until reach its limit, in this case current source I10 will have a decay from $I_1$ value when node n1 voltage is close to reference node 106 voltage (0 V) and also because of reaching the limit $V_{GS2}=V_{DD}$. After this point, as $V_{DDO}$ approaches $V_{DD}$, only $V_{DS1}$ decreases ($V_{DS1}=V_{DD}-V_{DDO}$) and therefore $I_{LIM}$ decreases. Notice that it is possible to limit $V_{GS2}$ voltage in other ways, such as, for instance, by using a zener diode or the like.

In sum, when $V_{DD}$ is greater than $V_{DDO}$ and transistor M2 is in saturation, transistors M1 and M2 act as a current mirror. When the value of $V_{DD}$ is close to $V_{DDO}$ and M2 is in triode, the value of the current limitation provided by transistor M1 rises because $(W_4/L_4)>(W_3/L_3)$. Moreover, when $V_{DD}$ has approximately the same value as $V_{DDO}$ and M2 is in its linear region, M3 has less current capability than M4, and node n1 is pulled down to reference node 106, and therefore transistor M1, in this state, provides no current limitation.

Figure 3:
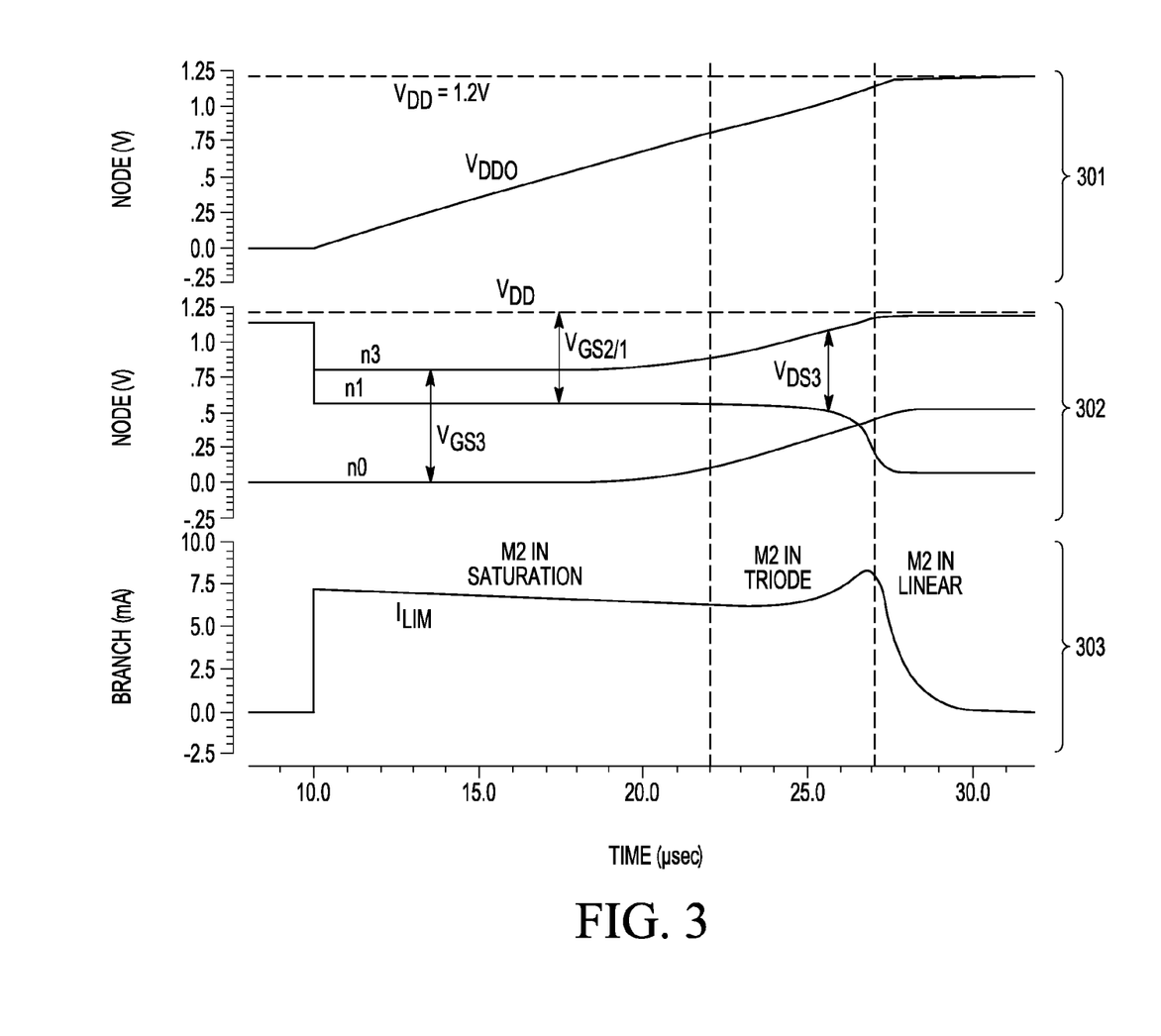
FIG. 3 shows graphs illustrating aspects of the operation of a power switch with current limitation according to some embodiments.

To illustrate the foregoing, the graphs of FIG. 3 show aspects of the operation of switching circuit 103 according to some embodiments. Particularly, graph 301 shows the values of $V_{DD}$ and $V_{DDO}$ change during a transition (e.g., power-up) period. In this example, it may be noted that $V_{DD}$ voltage is constant (1.2 V), whereas it takes $V_{DDO}$ approximately 20 μs to reach the same value as $V_{DD}$. In some cases, the transition period may last 30 μs or less.

Graph 302 shows the various node voltages of n0, n1, and n2 as $V_{DDO}$ changes over the course of the transition period, as well as the $V_{GS}$ voltages for transistors M3 and M2. Meanwhile, graph 303 shows the variations of current $I_{LIM}$ during the transition. It may be noted that, while transistor M2 is in saturation (between approximately 10 μs and 22 μs) and in triode (between approximately 22 μs and 29 μs) modes, the value of $I_{LIM}$ stays constant. When transistor M2 switches from triode to linear modes (at approximately 29 μs when $V_{DDO}$ voltage is very close to $V_{DD}$), the voltage at node n1 is pulled to reference node 106 and the value of $I_{LIM}$ increases before dropping to zero.

Figure 4:
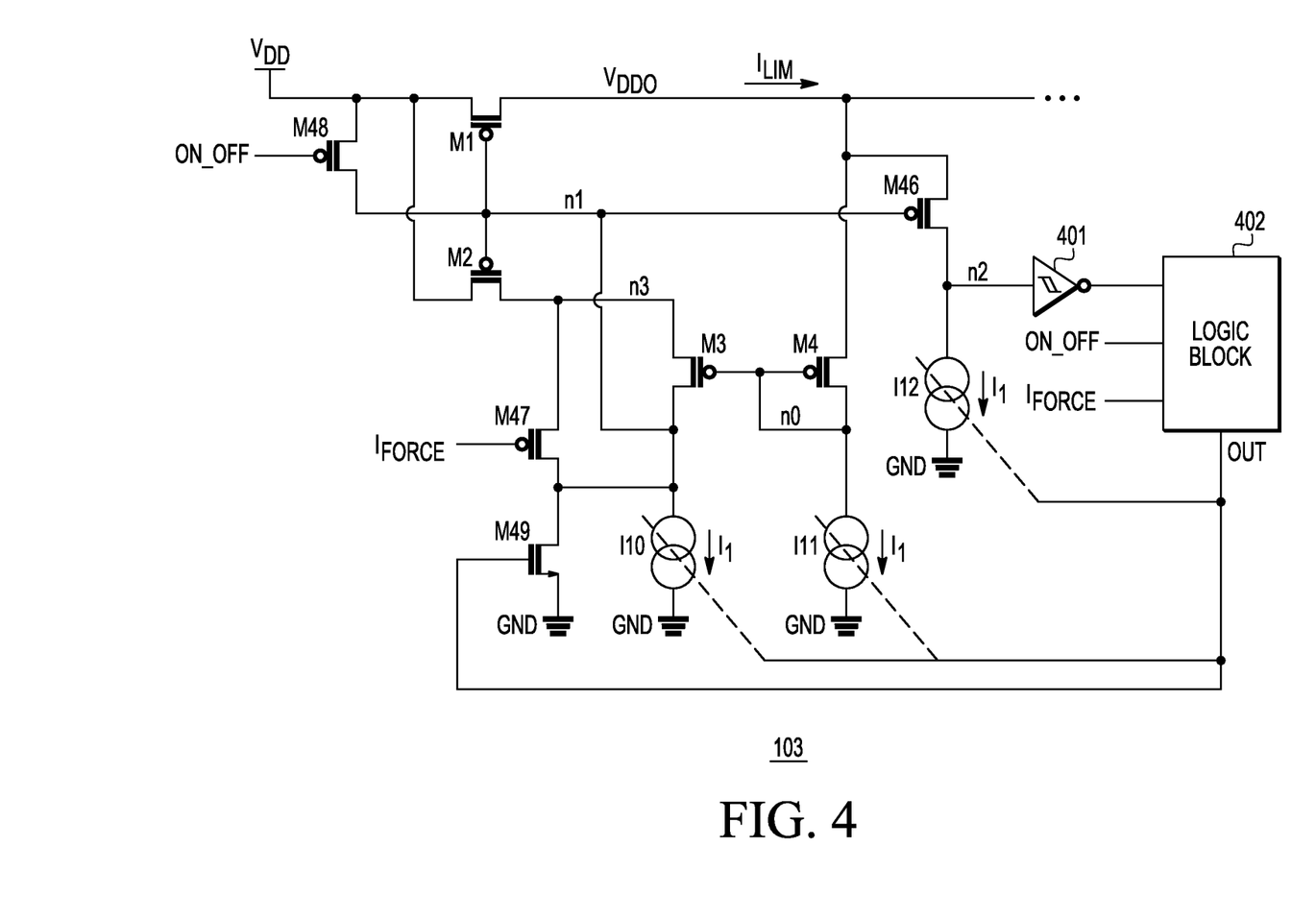
FIG. 4 is a circuit diagram of an example of a power switch with current limitation and zero Direct Current (DC) power consumption according to some embodiments.

FIG. 4 is a circuit diagram of an example of switching circuit 103 with current limitation and zero Direct Current (DC) consumption. In contrast with in FIG. 3, this embodiment adds PMOS transistors M46, M47, M48, and M49, as well as inverter 401 and logic block 402. Transistor M48 has its source coupled to the source of transistor M1 and its drain coupled to the gate of transistor M46. Transistor M46 has its source coupled to the drain of transistor M1 and its drain coupled to node n2 and to current source I12. Transistor M47 has its source coupled to the source of transistor M3 and its drain coupled to node n1, to drain of M3 and to source current I10.

In operation, transistor M46 is configured to operate as an end-of-transition sensor. When an "on-off" signal is applied to make transistor M48 non-conductive as the transition begins, transistor M46 detects whether the difference between $V_{DDO}$ and $V_{DD}$ is below a threshold level (this means $V_{DDO}$ is very close to $V_{DD}$), and provides a signal indicative of whether the transition period has ended to inverter 401. Inverter 401 is in turn coupled to logic circuitry 402, and is configured to receive that indication and to turn off current sources I10, I11, and I12, and make transistor M49 conductive in response to the transition period having ended. As such, upon receiving the same "on-off" signal as transistor M48, logic circuitry 403 is able to null current consumption if switch 103 is stable, whether M1 is conductive (that is, switch 103 is "on") or non-conductive (that is, switch 103 is "off").

As explained above, after the transition period is complete, transistor M1 is fully conductive and does not provide current limitation. In this case, the current limitation feature may be retriggered by making transistor M47 conductive and by turning on current sources I10, I11, and I12, while making transistor M49 non-conductive. In this configuration, transistors M1 and M2 are forced to a current mirror configuration and the current limitation feature is active.

It should also be noted that, although the foregoing circuit analysis has been done with MOS transistor equations for strong inversion, the circuits described herein perform the same operations with MOS transistors operating in moderate or weak inversion regions. In this scenario, the current limitation has the same value as in the strong inversion region, while transistors M1 and M2 are in saturation mode.

As a person of ordinary skill in the art will understand in light of this disclosure, each of the various transistors discussed above may itself represent a plurality of transistors in suitable configurations (e.g., in parallel with each other). Moreover, although the examples described above make use of PMOS transistors, similar principles may be applied to design a power switch with current limitation and zero DC consumption using NMOS technologies.

Figure 5:
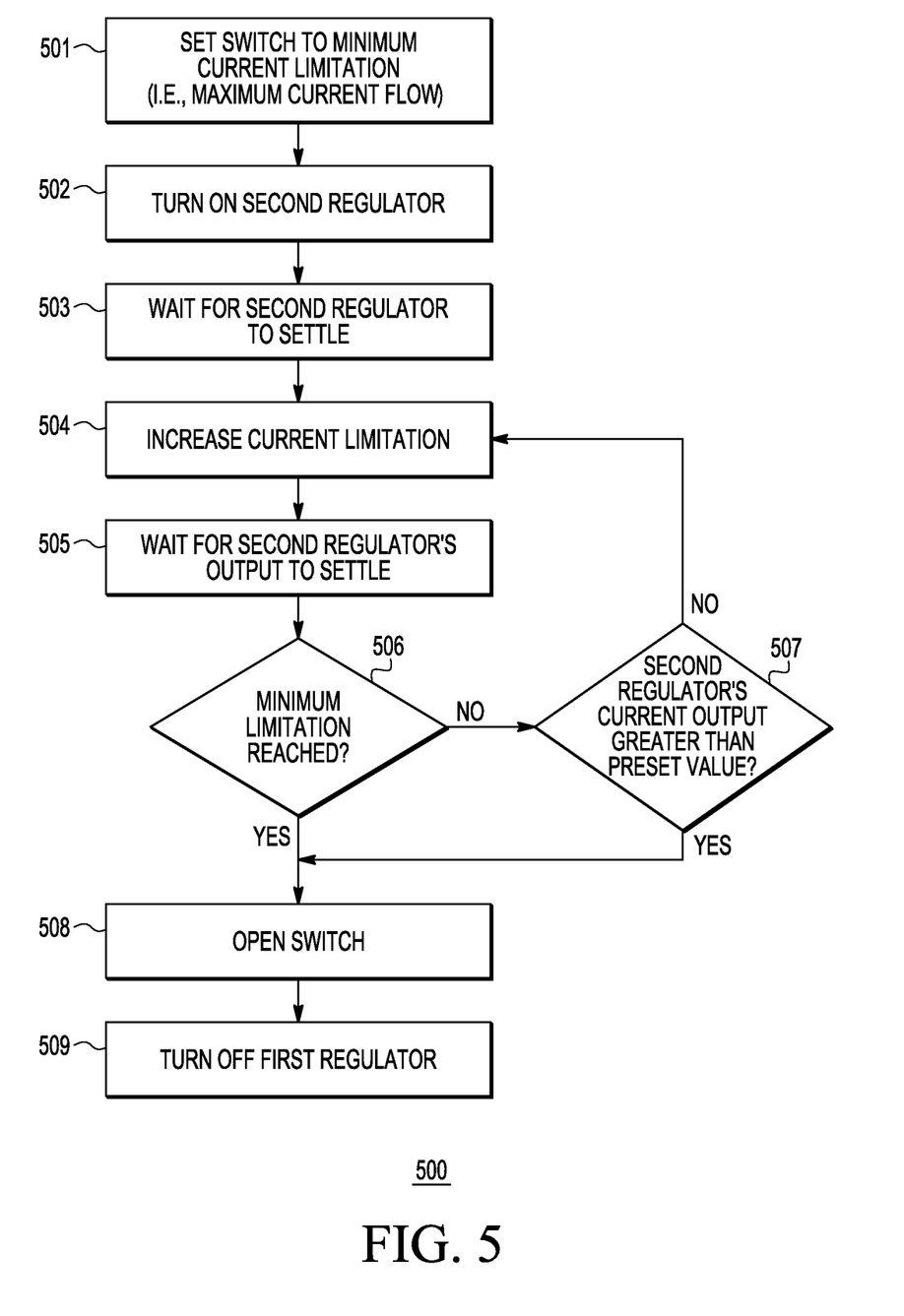
FIG. 5 is a flowchart of a method for enabling power gating techniques with smooth transition according to some embodiments.

FIG. 5 is a flowchart of method 500 for enabling power gating techniques with smooth transition. In some embodiments, method 500 may be performed, at least in part, by switching circuit 103 shown in FIGS. 1, 2, and 4. At block 501, method 500 includes setting switching circuit 103 to provide a current limitation with a maximum value of switch passing current, for example, by setting the $I_{FORCE}$ signal shown in FIG. 4 to a low state and setting the $I_1$ current(s) to a maximum value (which increases the resistance of switch 103 such that the amount of switch voltage drop is slightly increased. Block 502 includes turning on second regulator 102, at least in part, due to the reduced current flowing through switching circuit 103. In some cases, pull down circuit within second regulator 102 may be enabled so that, even when there is no load condition, there is a finite voltage drop across switching circuit 103, causing second regulator 102 to turn on.

At block 503, method 500 includes waiting a predetermined amount of time for the output of second regulator 102 to settle and/or detecting another change in the circuit. At block 504, method 500 includes increasing the current limitation imposed by switching circuit 103, for example, by decreasing the $I_1$ current(s) and/or decreasing the size ratio of transistors M1/M2 (which increases the resistance of switch 103). Block 505 includes again waiting for the second regulator 102's output to settle.

Block 506 determines whether the maximum current limitation reached its minimum value (or maximum resistance short of being completely open) offered by switching circuit 103. If so, the switching circuit 103 is opened at block 508 and block 509 turns off first regulator 101. Otherwise, control returns to block 504 and the current limitation of switching circuit 103 is increased further.

In some cases, the output of the second regulator may be sensed and evaluated at block 507, even when the maximum current limitation (or minimum current value allowed to pass by switch 103) offered by switching circuit 103 has not yet been reached. In those situations, method 500 may end sooner—that is, before the maximum current limitation has been reached—in response to the output of second regulator 102 having met a preset voltage and/or current value, in which case control passes to block 508.

Figure 6:
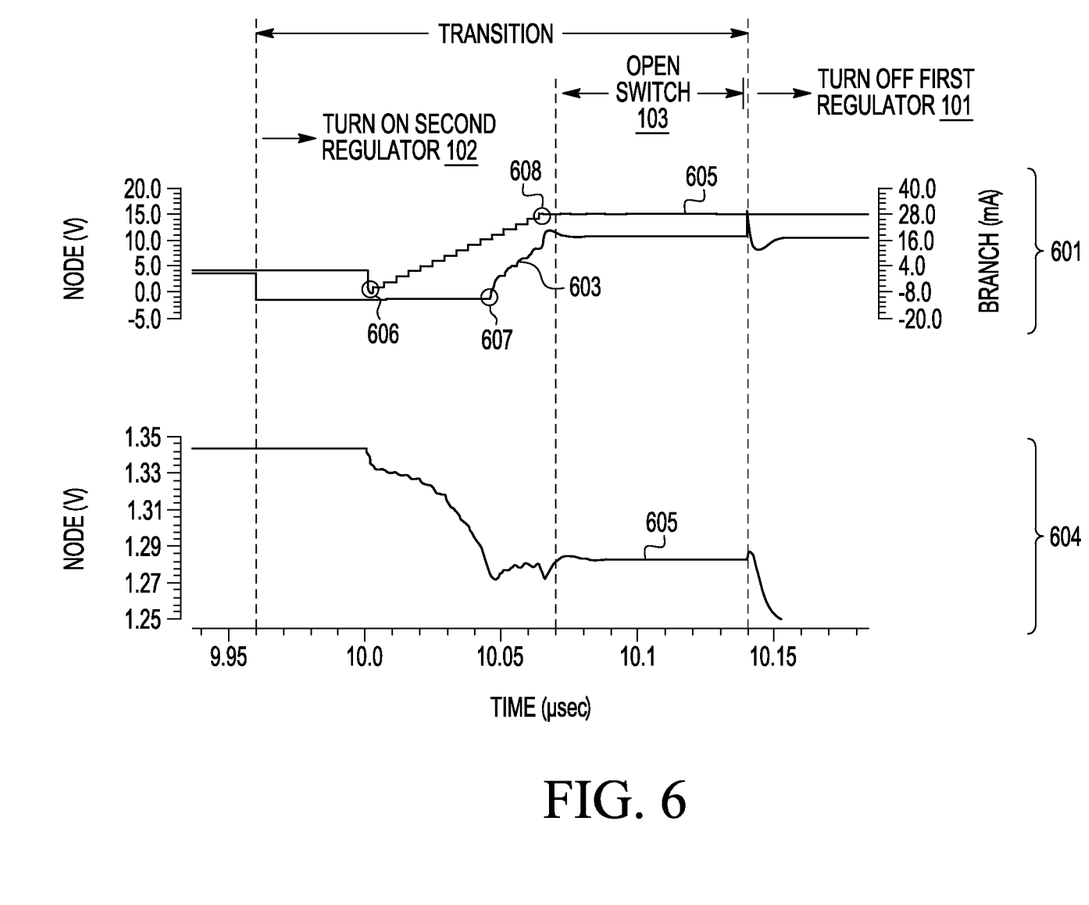
FIG. 6 shows graphs illustrating methods for enabling power gating techniques with smooth transition according to some embodiments.

FIG. 6 shows graphs illustrating methods for enabling power gating techniques with smooth transition according to some embodiments. Particularly, in graph 601, curve 602 shows an amount of current limitation provided by switching circuit 103 over time, and curve 603 shows the current provided by second regulator 102 over time. In graph 604, curve 605 shows the voltage applied to integrated circuit 104 (or portions thereof) during a transition period when first regulator 101 is turned off and second regulator 102 is turned on.

It may be noted from FIG. 6 that point 606 is the instant when switching circuit 103 begins to limit the current flowing through it, and that limitation occurs in incremental steps up until point 608, when switching circuit 103 provides a maximum amount of current limitation. After that point, first regulator 101 is turned off. Point 607 shows the instant when second regulator 102 begins to supply current. Prior to point 607, second regulator 102 was turned on, but because the value of $V_{DDO}$ was above the regulation point of second regulator 102, no current passed it. As a result, curve 605 shows a well-behaved, smooth voltage variation during the transition period (between points 606 and 608). In the absence of switching circuit 103 with current limitation, curve 103 would include an impulse response due to a sudden change in supply voltage (from approximately 1.35 V to approximately 1.28 V).

To illustrate curve 608 further, table I below shows an example of a range of 4-bit words that logic circuit 402 may use in order to control the current limitation and/or resistance presented by switching circuit 103:

TABLE I

| bit 3 | bit 2 | bit 1 | bit 0 | $I_{LIM}$ (mA) |
| --- | --- | --- | --- | --- |
| 0 | 0 | 0 | 0 | 62.1 |
| 0 | 0 | 0 | 1 | 56.6 |
| 0 | 0 | 1 | 0 | 51.0 |
| 0 | 0 | 1 | 1 | 45.5 |
| 0 | 1 | 0 | 0 | 40.0 |
| 0 | 1 | 0 | 1 | 34.5 |
| 0 | 1 | 1 | 0 | 29.0 |
| 0 | 1 | 1 | 1 | 23.4 |
| 1 | 0 | 0 | 0 | 20.7 |
| 1 | 0 | 0 | 1 | 17.9 |
| 1 | 0 | 1 | 0 | 15.2 |
| 1 | 0 | 1 | 1 | 12.4 |
| 1 | 1 | 0 | 0 | 9.7 |
| 1 | 1 | 0 | 1 | 6.9 |
| 1 | 1 | 1 | 0 | 4.1 |
| 1 | 1 | 1 | 1 | 1.4 |

As described herein, in an illustrative, non-limiting embodiment, an electronic device may include an integrated circuit including a plurality of power domains; a first voltage regulator coupled to a given one of the plurality of power domains; a second voltage regulator coupled to the given one of the plurality of power domains; and a switching circuit coupled between the first power regulator and the second power regulator, the switching circuit configured to control an amount of current drawn by the given one of the plurality of power domains from at least one of the first or second voltage regulators during a transition period.

The transition period may include a turning off of the first voltage regulator and a turning on of the second voltage regulator. The first voltage regulator may be configured to enable operation of at least a portion of the integrated circuit in a first power mode, the second voltage regulator may be configured to enable operation of the at least one portion of the integrated circuit in a second power mode, and the first power mode may provide more current than the second power mode. In some implementations, the integrated circuit, the second voltage regulator, and the switching circuit may be within a same electronic package, and the first voltage regulator may be external to the electronic package.

The electronic device may further include a logic circuit coupled to the switching circuit, the logic circuit configured to gradually change the amount of current in discrete time intervals during the transition period. The logic circuit may be further configured to reduce the amount of current from a first value to a second value, wait until an output of the second voltage regulator has settled, and reduce the amount of current from the second value to a third value, where a difference between the first and second values is equal to a difference between the second and third values. Additionally or alternatively, the logic circuit may be further configured to decrease the amount of current until a minimum predetermined amount of current is reached. Additionally or alternatively, the logic circuit is further configured to decrease the amount of current until the second voltage regulator outputs a predetermined voltage level or a predetermined amount of current.

In some implementations, the switching circuit may include a first current mirror including a first transistor and a second transistor, the first transistor including a first current terminal coupled to an output of the first voltage regulator, the first transistor including a second current terminal coupled to the second voltage regulator, the second transistor including a first current terminal coupled to the first current terminal of the first transistor, and the second transistor including a control terminal coupled to a control terminal of the first transistor. The switching circuit may also include a second current mirror including a third transistor and a fourth transistor, the third transistor including a first current terminal coupled to a second current terminal of the second transistor, the third transistor including a second current terminal coupled to a first current source and to the control terminals of the first and second transistors, the fourth transistor including a first current terminal coupled to the second current terminal of the first transistor, the fourth transistor including a second current terminal coupled to a second current source, and the fourth transistor including a control terminal coupled to a control terminal of the third transistor and to the second current terminal of the fourth transistor.

In some cases, the amount of current may be proportional to an aspect ratio of the first transistor divided by an aspect ratio of the second transistor. Also, an aspect ratio of the fourth transistor may be greater than an aspect ratio of the third transistor.

In another illustrative, non-limiting embodiment, a method may include controlling an impedance of a switching circuit to change an amount of current flowing through the switching circuit, wherein the switching circuit is coupled to a given one of a plurality of power domains of an integrated circuit, wherein the integrated circuit is configured to operate in a first mode followed by a second mode such that a transition period occurs between the first and second modes, wherein the switching circuit is coupled to a first regulator and to a second regulator, wherein the first regulator is configured to provide more power to the integrated circuit than the second regulator, and wherein the transition period includes a turning off of the first voltage regulator and a turning on of the second voltage regulator.

The method may further include decoupling the switching circuit from a ground node in response to a determination that the transition period has ended. Controlling the amount of current may include decreasing the amount of current until a minimum predetermined amount of current is reached. Additionally or alternatively, controlling the amount of current may include decreasing the amount of current until the second voltage regulator outputs a predetermined voltage or a predetermined current.

Additionally or alternatively, controlling the amount of current may include gradually changing a resistance presented by the switching circuit in discrete time intervals during the transition period. In some cases, Gradually changing the resistance may include reducing the amount of current from a first value to a second value, waiting until an output of the second voltage regulator settles, and reducing the amount of current from the second value to a third value.

In yet another illustrative, non-limiting embodiment, an integrated circuit may include switching circuitry coupled between a first voltage regulator and a second voltage regulator, the first and second voltage regulators configured to provide power to an integrated circuit, and the switching circuitry configured to impose gradually increasing limits upon an amount of current drawn by the integrated circuit from the first voltage regulator during a transition period. The transition period may include a turning off of the first voltage regulator and a turning on of the second voltage regulator, and the switching circuitry may be further configured to consume zero Direct Current (DC) power outside of the transition period.

In many implementations, the systems and methods disclosed herein may be incorporated into a wide range of electronic devices including, for example, computer systems or Information Technology (IT) products such as servers, desktops, laptops, memories, switches, routers, etc.; telecommunications hardware; consumer devices or appliances such as mobile phones, tablets, television sets, cameras, sound systems, etc.; scientific instrumentation; industrial robotics; medical or laboratory electronics such as imaging, diagnostic, or therapeutic equipment, etc.; transportation vehicles such as automobiles, buses, trucks, trains, watercraft, aircraft, etc.; military equipment, etc. More generally, these systems and methods may be incorporated into any device or system having one or more electronic parts or components.

Figure 7:
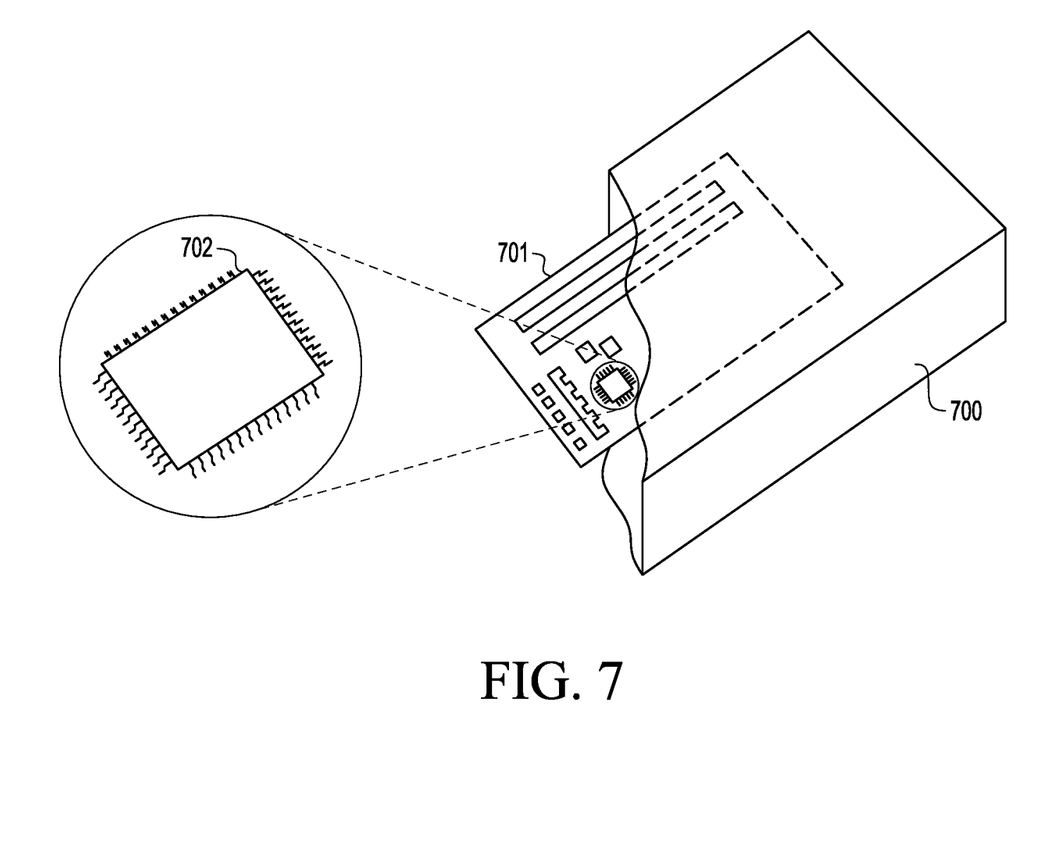
FIG. 7 is a diagram of an example of an electronic system having one or more electronic microelectronic device packages, according to some embodiments.

Turning to FIG. 7, a block diagram of electronic system 700 is depicted. In some embodiments, electronic system 700 may be include of the aforementioned electronic devices, or any other electronic device. As illustrated, electronic system 700 includes one or more Printed Circuit Boards (PCBs) 701, and at least one of PCBs 701 includes one or more microelectronic device packages(s) 702. In some implementations, device package(s) 702 may include one or more circuits for enabling power gating techniques with smooth transition as discussed above.

Examples of device package(s) 702 may include, for instance, a System-On-Chip (SoC), an Application Specific Integrated Circuit (ASIC), a Digital Signal Processor (DSP), a Field-Programmable Gate Array (FPGA), a processor, a microprocessor, a controller, a microcontroller (MCU), a Graphics Processing Unit (GPU), or the like. Additionally or alternatively, device package(s) 502 may include a memory circuit or device such as, for example, a Random Access Memory (RAM), a Static RAM (SRAM), a Magnetoresistive RAM (MRAM), a Nonvolatile RAM (NVRAM, such as "FLASH" memory, etc.), and/or a Dynamic RAM (DRAM) such as Synchronous DRAM (SDRAM), a Double Data Rate RAM, an Erasable Programmable ROM (EPROM), an Electrically Erasable Programmable ROM (EEPROM), etc. Additionally or alternatively, device package(s) 702 may include one or more mixed-signal or analog circuits, such as, for example, Analog-to-Digital Converter (ADCs), Digital-to-Analog Converter (DACs), Phased Locked Loop (PLLs), oscillators, filters, amplifiers, etc. Additionally or alternatively, device package(s) 702 may include one or more Micro-ElectroMechanical Systems (MEMS), Nano-Electro-Mechanical Systems (NEMS), or the like.

Generally speaking, device package(s) 702 may be configured to be mounted onto PCB 701 using any suitable packaging technology such as, for example, Ball Grid Array (BGA) packaging or the like. In some applications, PCB 701 may be mechanically mounted within or fastened onto electronic device 700. It should be noted that, in certain implementations, PCB 701 may take a variety of forms and/or may include a plurality of other elements or components in addition to device package(s) 702. It should also be noted that, in some embodiments, PCB 701 may not be used and/or device package(s) 702 may assume any other suitable form(s).

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. An electronic device, comprising:
    an integrated circuit including a plurality of power domains;
    a first voltage regulator coupled to a given one of the plurality of power domains;
    a second voltage regulator coupled to the given one of the plurality of power domains; and
    a switching circuit coupled between the first power regulator and the second power regulator, the switching circuit configured to gradually change an amount of current drawn by the given one of the plurality of power domains from at least one of the first or second voltage regulators during a transition period, wherein the switching circuit is conductive during the entire transition period.

2. The electronic device of claim 1, wherein the transition period includes a turning off of the first voltage regulator and a turning on of the second voltage regulator.

3. The electronic device of claim 1, wherein the first voltage regulator is configured to enable operation of at least a portion of the integrated circuit in a first power mode, wherein the second voltage regulator is configured to enable operation of the at least one portion of the integrated circuit in a second power mode, and wherein the first power mode provides more current than the second power mode.

4. The electronic device of claim 1, wherein the integrated circuit, the second voltage regulator, and the switching circuit are within a same electronic package, and wherein the first voltage regulator is external to the electronic package.

5. The electronic device of claim 1, further comprising a logic circuit coupled to the switching circuit, the logic circuit configured to gradually decrease the amount of current in discrete time intervals during the transition period.

6. The electronic device of claim 5, wherein the logic circuit is further configured to reduce the amount of current from a first value to a second value, wait until an output of the second voltage regulator has settled, and reduce the amount of current from the second value to a third value, wherein a difference between the first and second values is equal to a difference between the second and third values.

7. The electronic device of claim 5, wherein the logic circuit is further configured to decrease the amount of current until a minimum predetermined amount of current is reached.

8. The electronic device of claim 5, wherein the logic circuit is further configured to decrease the amount of current until the second voltage regulator outputs a predetermined voltage level or a predetermined amount of current.

9. The electronic device of claim 1, the switching circuit further comprising:
    a first current mirror including a first transistor and a second transistor, the first transistor including a first current terminal coupled to an output of the first voltage regulator, the first transistor including a second current terminal coupled to the second voltage regulator, the second transistor including a first current terminal coupled to the first current terminal of the first transistor, and the second transistor including a control terminal coupled to a control terminal of the first transistor; and
    a second current mirror including a third transistor and a fourth transistor, the third transistor including a first current terminal coupled to a second current terminal of the second transistor, the third transistor including a second current terminal coupled to a first current source and directly coupled to the control terminals of the first and second transistors, the fourth transistor including a first current terminal coupled to the second current terminal of the first transistor, the fourth transistor including a second current terminal coupled to a second current source, and the fourth transistor including a control terminal coupled to a control terminal of the third transistor and to the second current terminal of the fourth transistor.

10. The electronic device of claim 9, wherein the amount of current is proportional to an aspect ratio of the first transistor divided by an aspect ratio of the second transistor.

11. The electronic device of claim 10, wherein an aspect ratio of the fourth transistor is greater than an aspect ratio of the third transistor.

12. A method, comprising:
controlling an impedance of a switching circuit to change an amount of current flowing through the switching circuit, wherein the switching circuit is coupled to a given one of a plurality of power domains of an integrated circuit, wherein the integrated circuit is configured to operate in a first mode followed by a second mode such that a transition period occurs between the first and second modes, wherein the switching circuit is conductive during the entire transition period, wherein the switching circuit is coupled to a first regulator and to a second regulator, wherein the first regulator is configured to provide more power to the integrated circuit than the second regulator, and wherein the transition period includes a turning off of the first voltage regulator and a turning on of the second voltage regulator.

13. The method of claim 12, further comprising decoupling the switching circuit from a ground node in response to a determination that the transition period has ended.

14. The method of claim 12, wherein controlling the amount of current includes decreasing the amount of current until a minimum predetermined amount of current is reached.

15. The method of claim 12, wherein controlling the amount of current includes decreasing the amount of current until the second voltage regulator outputs a predetermined voltage or a predetermined current.

16. The method of claim 12, wherein controlling the amount of current includes gradually changing a resistance presented by the switching circuit in discrete time intervals during the transition period.

17. The method of claim 16, wherein gradually changing the resistance includes reducing the amount of current from a first value to a second value, waiting until an output of the second voltage regulator settles, and reducing the amount of current from the second value to a third value.

18. An integrated circuit, comprising:
switching circuitry coupled between a first voltage regulator and a second voltage regulator, the first and second voltage regulators configured to provide power to an integrated circuit, and the switching circuitry configured to remain conductive during an entire transition period, to impose gradually increasing limits upon an amount of current drawn by the integrated circuit from the first voltage regulator during the transition period.

19. The integrated circuit of claim 18, wherein the transition period includes a turning off of the first voltage regulator and a turning on of the second voltage regulator.

20. The integrated circuit of claim 18, the switching circuitry further configured to consume zero Direct Current (DC) power outside of the transition period.

* * * * *